United States Patent [19]

Chan et al.

[11] Patent Number: 5,066,873
[45] Date of Patent: Nov. 19, 1991

[54] INTEGRATED CIRCUITS WITH REDUCED SWITCHING NOISE

[75] Inventors: Yiu-Fai Chan, Los Altos Hills; Chang-Chia Hsiao, Cupertino; James A. Watson, Santa Clara, all of Calif.

[73] Assignee: Altera Corporation, San Jose, Calif.

[21] Appl. No.: 444,993

[22] Filed: Dec. 4, 1989

[51] Int. Cl.[5] .................... H03K 17/16; H03K 5/12; H03K 19/003
[52] U.S. Cl. ..................... 307/443; 307/263; 307/296.8; 307/572; 307/542
[58] Field of Search .............. 307/443, 310, 263, 451, 307/296.8, 572, 542

[56] References Cited

U.S. PATENT DOCUMENTS

| | | | |
|---|---|---|---|
| 4,581,673 | 4/1986 | Pang | 361/58 |
| 4,609,986 | 9/1986 | Hartmann et al. | 364/200 |
| 4,617,479 | 10/1986 | Hartmann et al. | 307/465 |
| 4,638,187 | 1/1987 | Boler et al. | 307/451 |
| 4,791,326 | 12/1988 | Vajdic et al. | 307/571 |
| 4,857,770 | 8/1989 | Partovi et al. | 307/451 |
| 4,862,018 | 8/1989 | Taylor et al. | 307/443 |
| 4,894,561 | 1/1990 | Nogami | 307/443 |

FOREIGN PATENT DOCUMENTS

| | | |
|---|---|---|
| 303341 | 2/1989 | European Pat. Off. |
| 337911 | 10/1989 | European Pat. Off. |
| 58-19035A | 2/1983 | Japan |
| 62-242418 | 10/1987 | Japan |
| 63-139425 | 6/1988 | Japan |

OTHER PUBLICATIONS

IBM Technical Disclosure Bulletin, vol. 32, No. 4A Sep. 1989, p. 18.
N. H. E. Weste et al., *Principles of CMOS VLSI Design*, Addison-Wesley Publishing Company, Reading, Mass., 1985, pp. 39–42.
S. Cheng et al., "Effects of Operating Temperature on Electrical Parameters in an Analog Process," *IEEE Circuits and Devices Magazine*, Jul. 1989, pp. 31–38.
W. J. Scarpero, "Field-Effect Transistor Bidirectional Driver Control Circuit," *IBM Technical Disclosure Bulletin*, vol. 16, No. 8, Jan. 1974, pp. 2442–2443.

*Primary Examiner*—Stanley D. Miller
*Assistant Examiner*—Andrew Sanders
*Attorney, Agent, or Firm*—Robert R. Jackson

[57] ABSTRACT

A new slew rate controlled output buffer with built-in temperature and voltage compensation for integrated circuits is designed to reduce VCC/VSS switching noise encountered in high speed, high current drive integrated circuit applications.

25 Claims, 7 Drawing Sheets

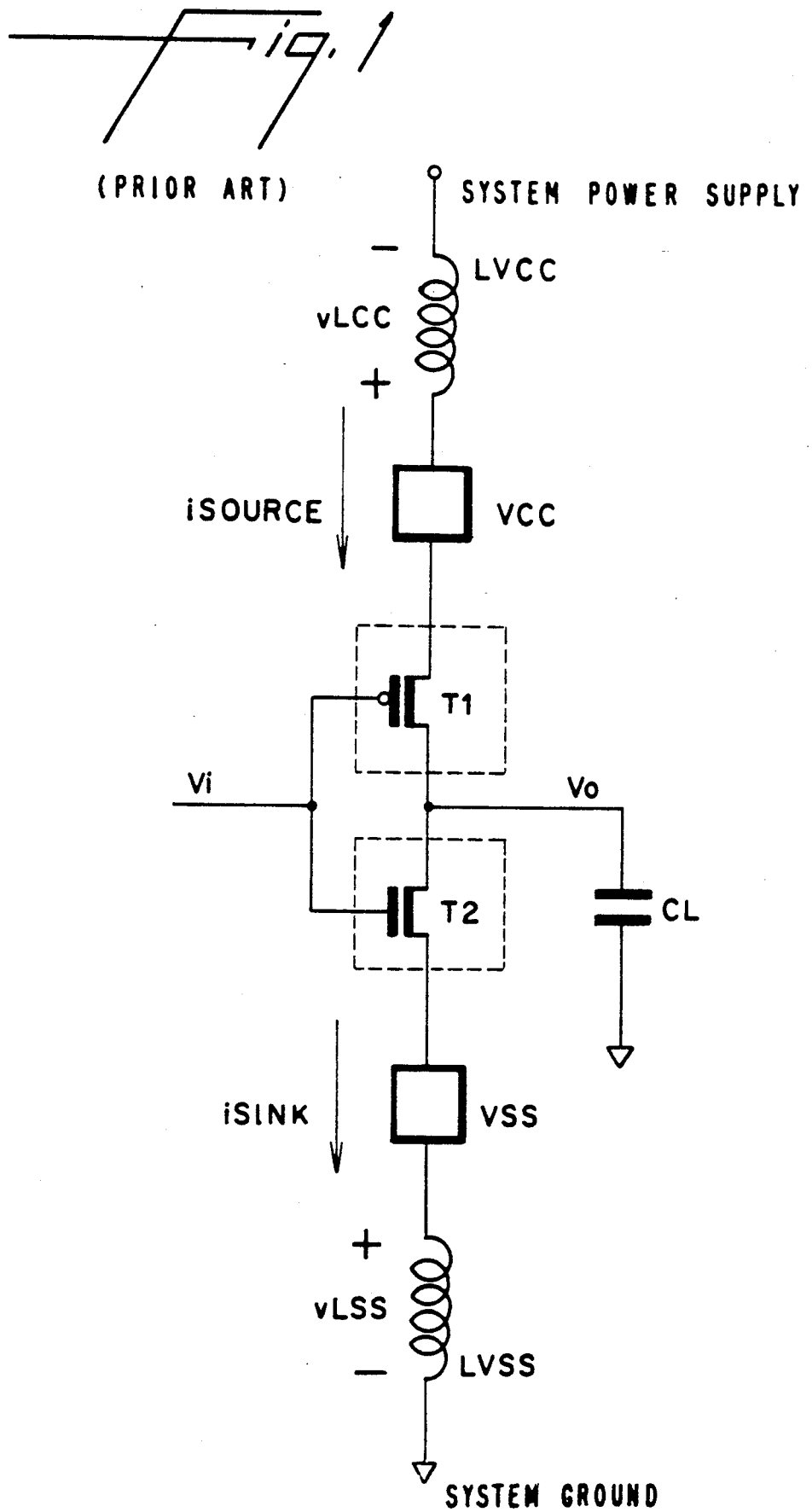

INTEGRATED CIRCUITS WITH REDUCED SWITCHING NOISE

BACKGROUND OF THE INVENTION

This invention relates to integrated circuits, and more particularly to integrated circuits in which the switching rate is automatically controlled in response to one or more factors in order to counteract circumstances which may otherwise lead to unacceptable noise in the circuit.

Increasing sophistication in CMOS (complementary metal oxide semiconductor) fabrication techniques has opened the door to use of CMOS devices in high speed, high current drive applications. Because bipolar circuits have historically dominated these market areas, it is necessary for a CMOS device to match all bipolar capabilities in order to compete successfully. Thus it is necessary for CMOS devices to develop the same high speed with high current drive that is commonly found in bipolar TTL (transistor-transistor logic) parts.

This high speed, high drive capability can cause undesirable peripheral effects, however. Chief among these effects is noise, which comes from two sources. The first of these sources is the high speed nature of the part. An integral concomitant of high speed is the ability to rapidly slew (change the state of) the output pins from a logical 0 to a logical 1 (or from a logical 1 to a logical 0). For traditional CMOS output stages, this means swinging from very close to 0 volts to very close to 5 volts. If the slew rate doubles, the corresponding instantaneous current flowing in the output also doubles. This can be seen by examining the relation shown below:

$$I = C \cdot dV/dt \quad (1)$$

For a fixed system capacitive load C, if the slew rate dV/dt increases by a factor of two, so does the corresponding instantaneous supply current I. This current flows through system wiring and package wire bonds which behave as inductors. Inductor function is described by the relation shown below:

$$V = L \cdot dI/dt \quad (2)$$

These inductors resist rapid change in the current flowing through them. For a fixed inductance L, if dI/dt increases by a factor of two, so does the corresponding noise voltage V. Since this current is either demanded from VCC or sunk into VSS, the noise voltage is superimposed onto one or both of these two supplies. This is referred to as supply voltage spiking.

The second source of noise is the high current drive capability of the part. If all outputs simultaneously attempt to source or sink a large amount of current, this can cause a large dI/dt, even in the absence of large capacitive loads at any one pin. Since the capability to source or sink these currents is necessary, a method must be found to control the operation of the outputs so that the large currents do not cause supply voltage spiking.

It is necessary that this spiking be tightly controlled because of the extremely disruptive effects that it can have upon system operation. Supply spiking can cause loss of data, change system operation in subtle or obvious ways, and generally causes a decrease in the reliability of the system. Because the conditions that cause extreme spiking are very dependent upon the exact configuration of the system, the spiking and its deleterious consequences can be intermittent and extremely difficult for the system designer to diagnose.

The severity of the spiking is directly proportional to the number of output circuits that switch simultaneously. If a chip has a large number of high drive outputs and it is possible for all of them to switch at the same time, managing supply noise can be a very intractable problem. Good examples of such devices are high pin count erasable programmable logic devices ("EPLDs") such as those described in Hartmann et al. U.S. Pat. No. 4,609,986 and Hartmann et al. U.S. Pat. No. 4,617,479.

A simplified CMOS output driver with VCC/VSS lead frame inductances (LVCC/LVSS) and capacitive load (CL) is shown in FIG. I. (There is also typically some lead frame inductance associated with the output pin, (i.e., with CL). However, this additional inductance is ignored in the following analysis because (1) its contribution is relatively small, especially where multiple output pins are being switched simultaneously, and (2) including it would greatly complicate the equations given below.) As is customary, VCC represents the pad on the integrated circuit chip which is the source of high electrical potential (e.g., +5 volts or logic 1) for the chip, and VSS represents the pad on the integrated circuit chip which is the source of low electrical potential (e.g., 0 volts, ground, or logic 0) for the chip. When Vi (the voltage of the data input) changes from LO (logic 0) to HI (logic 1), N-channel solid-state switching device T2 starts to turn on and P-channel solid-state switching device T1 starts to turn off. The current iSINK flows through T2, the VSS pad, and the inductance LVSS. The voltage build-up vLSS at the VSS pad is given by the following equation:

$$vLSS = (LVSS)(diSINK)/(dt) \quad (3)$$

The relationship between iSINK and the output terminal voltage Vo is given by the following equation:

$$iSINK = (-CL)(dVo)/(dt) \quad (4)$$

The relationship between the VSS pad noise voltage vLSS and the output terminal voltage Vo is derived by substituting equation (4) into equation (3) as follows:

$$vLSS = (-LVSS)(CL)(d^2Vo)/(dt^2) \quad (5)$$

If multiple outputs are switched simultaneously, the VSS pad noise voltage vLSS becomes:

$$vLSS = (-N)(LVSS)(CL)(d^2Vo)/(dt^2) \quad (6)$$

where N is the number of outputs being switched.

At approximately the same time that T2 is turning on as described above, P-channel solid-state switching device T1 is starting to turn off. This results in VCC pad noise voltage vLCC in accordance with the following equation:

$$vLCC = (-N)(LVCC)(CL)(d^2Vo)/(dt^2) \quad (7)$$

where N is again the number of outputs being switched simultaneously.

When Vi changes from HI to LO, similar noise voltages (of opposite polarity) are again produced at the VSS and VCC pads.

For a given integrated circuit package and a specified output load, the values of lead frame inductance (LVCC and LVSS) for the power pins are fixed and cannot be reduced.

Other attempts have been made to control internally generated switching noise. One attempt used a technique of staggering switching of the output drivers. If calculations show that switching more than a given number of outputs results in unacceptable noise, then circuitry can be developed that limits concurrent switching. Assume, for example, that a chip has 24 outputs. Simulations show that if more than 12 outputs switch at a time, then unacceptable noise will be produced. Circuitry can be implemented that prevents half of the outputs from switching at the same time as the other half. This is an effective method for controlling noise, but it adds delay elements to the signal path.

Another attempt to control noise uses staged turn-on of the output driver devices as described in Boler et al. U.S. Pat. No. 4,638,187. If it is shown that excess noise is produced when there is a given output driver size, then the output driver may be separated into two or more smaller pieces. Circuitry is then implemented to turn on each piece separately from the others. The single large noise pulse that occurs with the large output drivers may thus be separated into smaller, more manageable noise pulses.

The disadvantage of these two previous techniques is that they add fixed delay in the signal path. If, for example, the chip is being used as a decoder, it is possible for only one output to switch at a time. The disadvantage of both staggered and staged switching methods is that they exact a permanent performance penalty to prevent a problem that, depending on system operation, may never occur. Ideally, a circuit should limit speed only when switching noise generation becomes excessive.

In view of the foregoing, it is an object of this invention to provide integrated circuits which automatically compensate for one or more circumstances which may otherwise lead to unacceptable switching noise.

It is another object of this invention to provide integrated circuits in which the switching rate is automatically reduced when a higher switching rate would result in unacceptable noise.

SUMMARY OF THE INVENTION

These and other objects of the invention are accomplished in accordance with the principles of the invention by providing integrated circuits including means for sensing one or more circumstances which may lead to unacceptable switching noise, and for automatically slowing down the switching rate to compensate for these circumstances and thereby prevent such unacceptable switching noise. For example, the switching rate may be reduced when the potential of either VCC or VSS moves toward the potential of the other of these sources, thereby indicating that a large number of outputs are being switched at approximately the same time. Other examples include reducing the switching rate when the temperature of the integrated circuit drops, when the potential difference between VCC and VSS increases, and/or when the device has been fabricated with a relatively high drive capability, because each of these circumstances will otherwise tend to increase switching speed. Another feature of the invention which can optionally be used with the foregoing switching speed control is to replace the P-channel device T1 in the output driver pair with an N-channel device, thereby reducing the overall voltage swing associated with switching the associated output pad.

Further features of the invention, its nature and various advantages will be more apparent from the accompanying drawings and the following detailed description of the preferred embodiments.

BRIEF DESCRIPTION OF THE DRAWINGS

FIG. 1 is a schematic diagram of a portion of a prior art integrated circuit.

DETAILED DESCRIPTION OF THE PREFERRED EMBODIMENTS

Figure 2A:
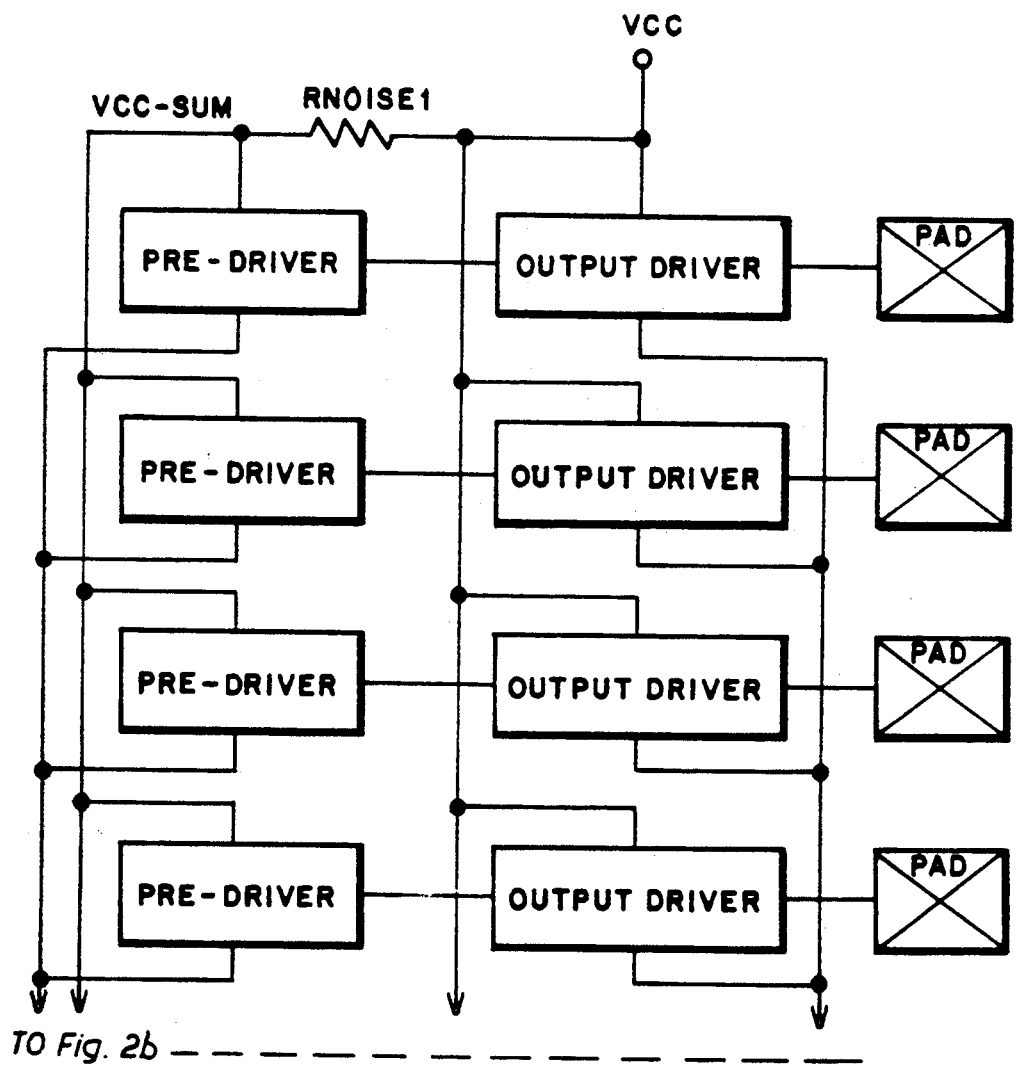
FIGS. 2a and 2b (hereinafter referred to collectively as FIG. 2) are a simplified schematic block diagram of a portion of an illustrative embodiment of an integrated circuit constructed in accordance with the principles of this invention.
Figure 2B:
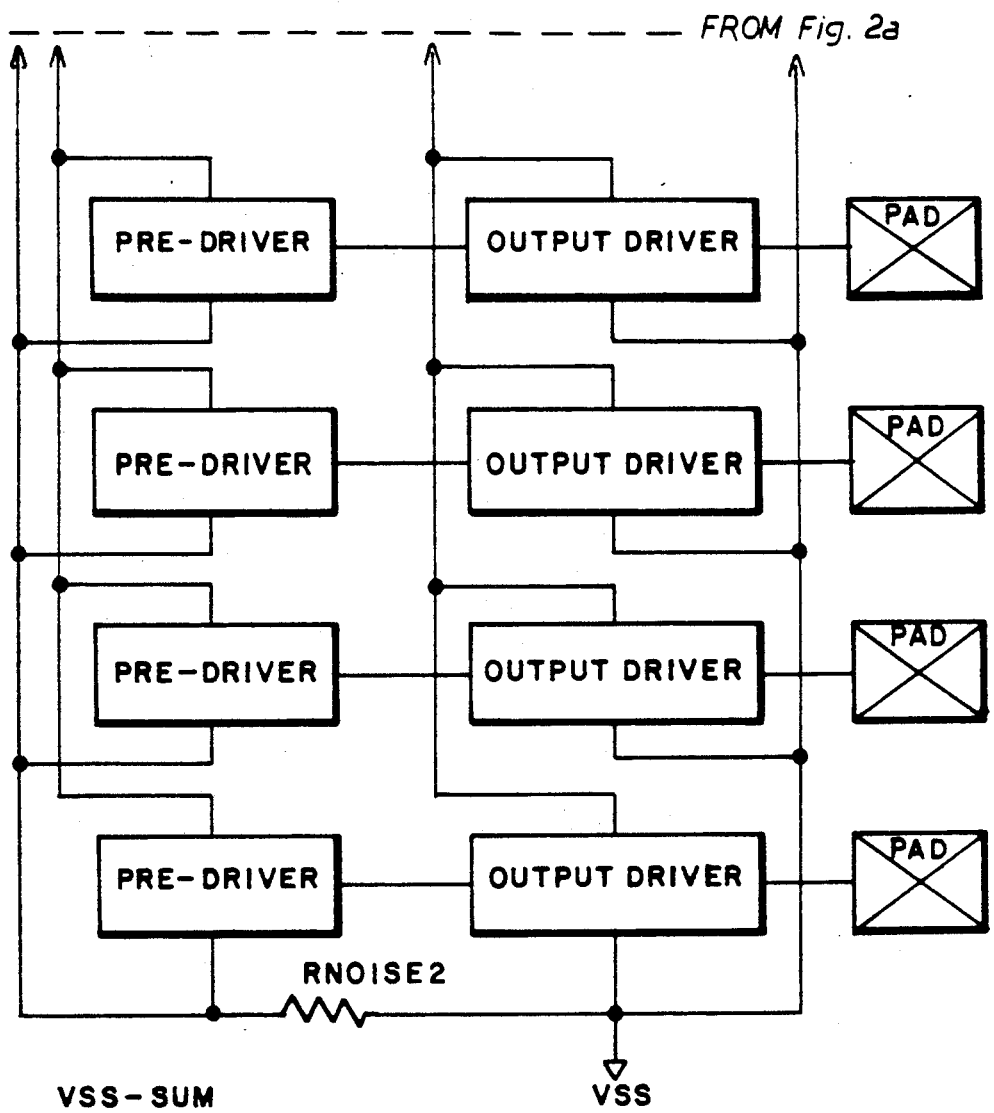
Figure 3A:
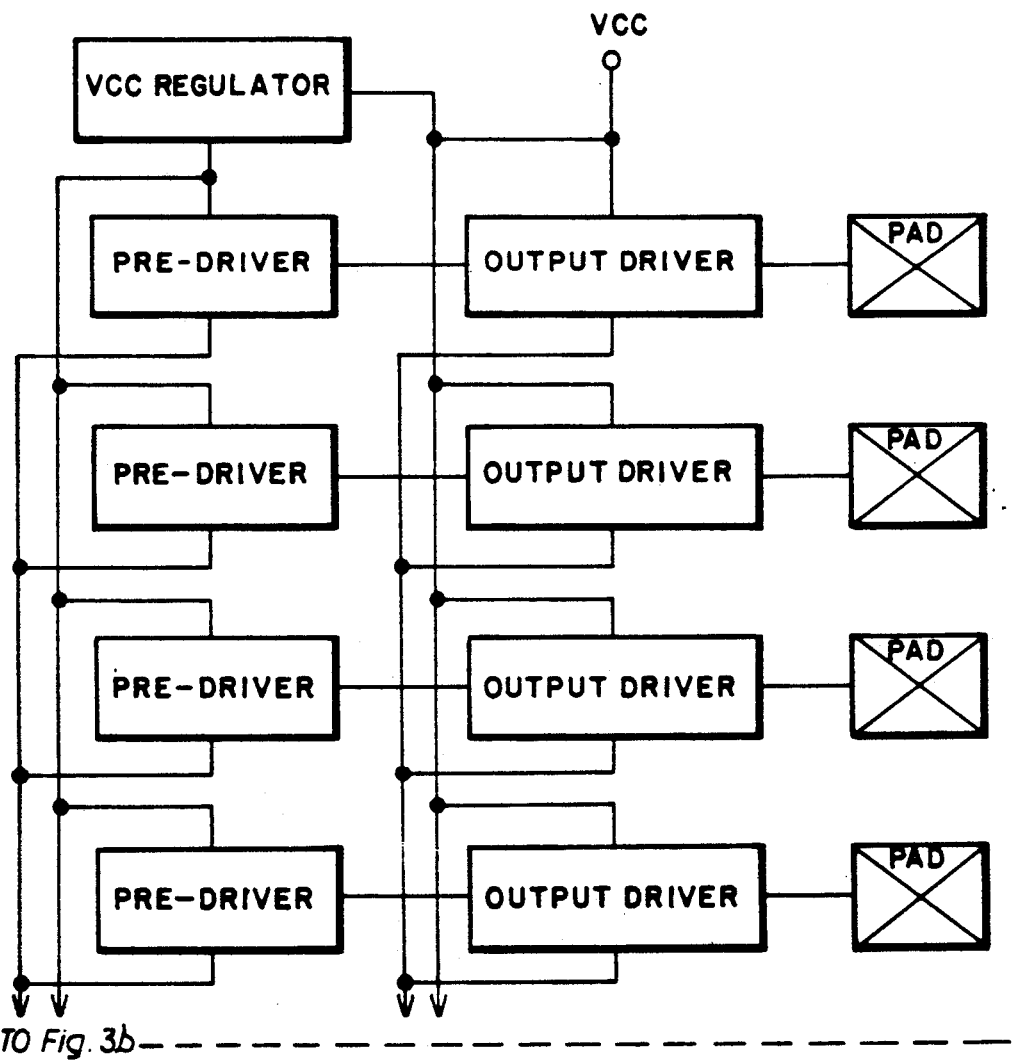
FIGS. 3a and 3b (hereinafter referred to collectively as FIG. 3) are a simplified schematic block diagram of a portion of another illustrative embodiment of an integrated circuit constructed in accordance with the principles of this invention.
Figure 3B:
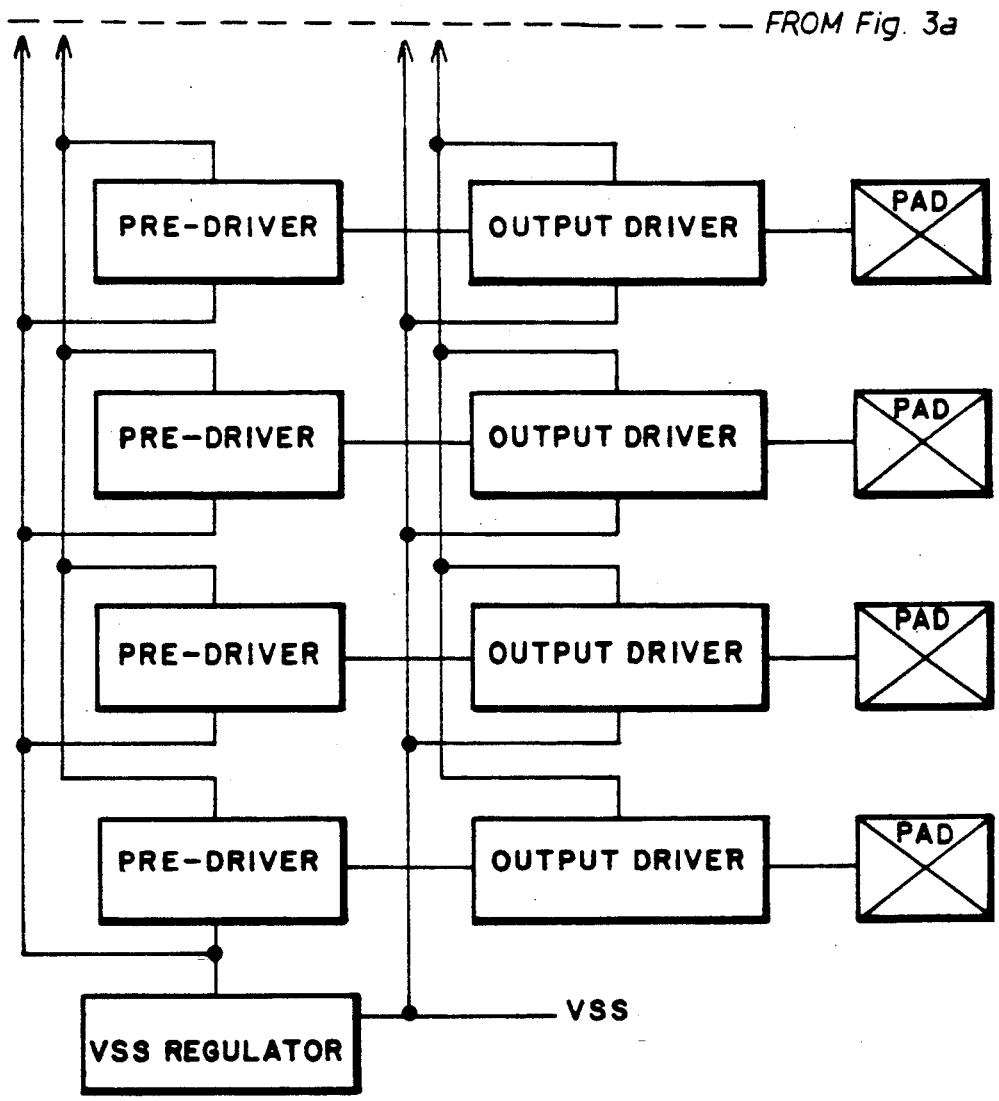

Illustrative circuits that meet the objectives mentioned above will first be described in general terms with reference to FIGS. 2 and 3. Then, more details of the actual circuit operation will be described in connection with FIGS. 4 and 5.

The first technique which can be used in accordance with the present invention to limit noise generation is to limit the speed of the output circuit as a function of noise detected in the onboard VCC and VSS supply lines. As is shown in FIG. 2, all of the output drivers share a common VCC and VSS supply. The noise produced on these lines is dependent upon two factors. The first of these is local noise, produced by the output drivers themselves. The second source of noise is system level, a combination of power supply spikes caused by all of the components in the system. VCC and VSS are summed together with all noise by summing resistors RNOISE1 and RNOISE2 and are used to supply the output predrivers. As noise increases, the drive capability of the predrivers is lessened. This in turn slows down the output drivers and serves as a negative feedback loop to lower noise back to within acceptable limits. The structure may be generalized as shown in FIG. 3 to facilitate explanation and implementation of the additional noise control techniques described below.

Figure 4:
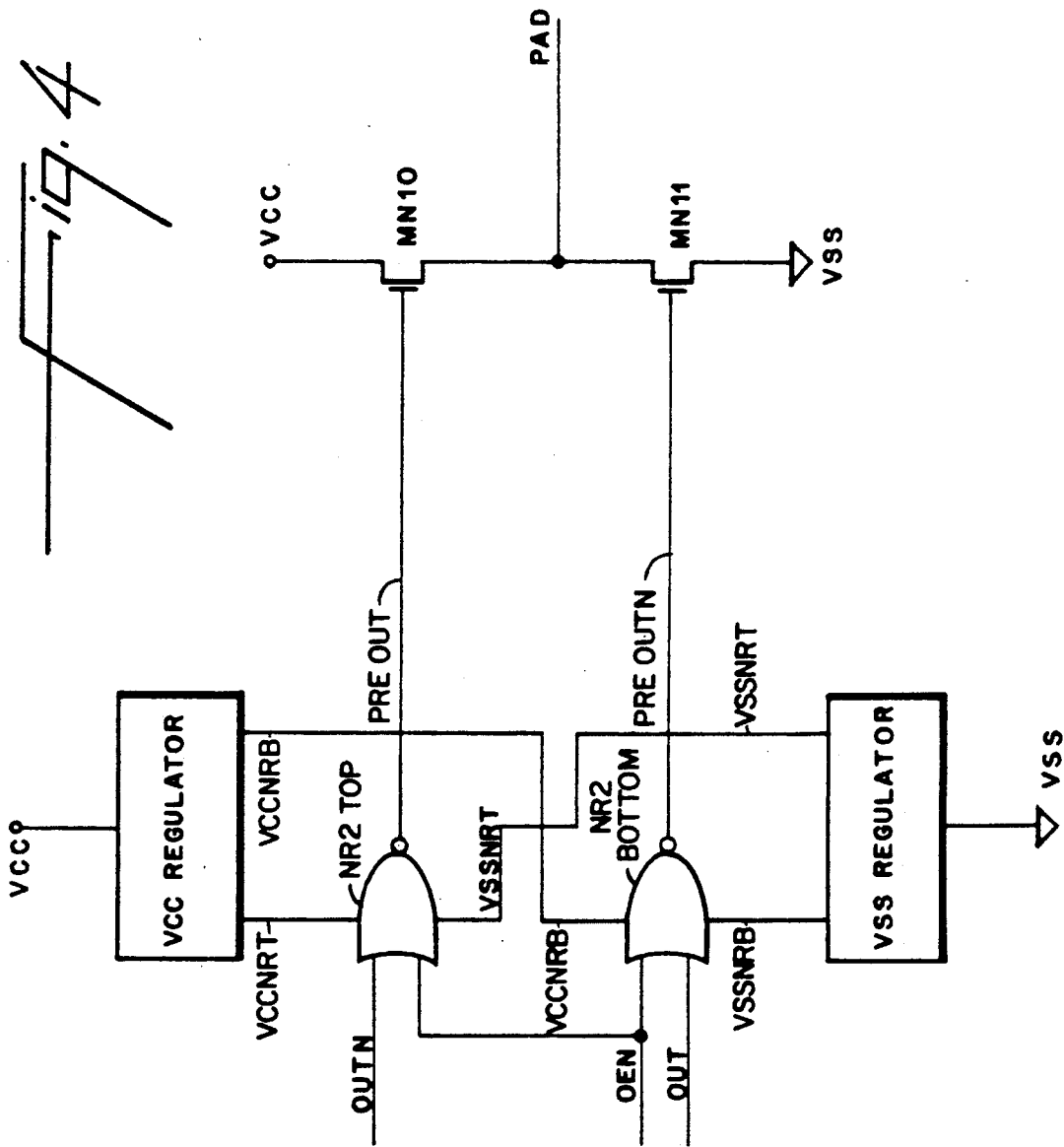
FIG. 4 is a more detailed schematic block diagram of a portion of the apparatus of FIG. 2 or FIG. 3.

The second technique which can be used in accordance with the present invention to limit noise generation is to control the current available to the output predriver as a function of temperature. CMOS circuits tend to switch more quickly as temperature decreases. This is because the transconductance $g_m$ of the MOS devices increases linearly as temperature decreases due to decreased lattice scattering of the carriers. (See, for example, S. Cheng et al., "Effects of Operating Temperature on Electrical Parameters in an Analog Process", IEEE Circuits and Devices Magazine, July 1989, pp. 31–38.) To effectively control noise, at least one of the VCC or VSS regulators in FIG. 3 includes an element (e.g., a temperature sensitive resistor) for sensing variation in the operating temperature of the chip. As shown in FIG. 4 (in which OUT corresponds to Vi in FIG. 1, OUTN is the logical inverse of OUT, and OEN is an inverted output enable signal typically generated by the logic circuitry which produces the OUT and OUTN signals), this information is used by the VCC or VSS regulator to adjust the series resistance between the output predriver NOR gates (NR2 TOP and NR2 BOTTOM) and their respective power supplies (In the absence of this invention, VCCNRT and VCCNRB would be connected directly to VCC, and VSSNRB and VSSNRT would be connected directly to VSS.) As the total resistance between each predriver NOR gate and the power supply increases, its drive capability is reduced and the speed of output switching is reduced.

The third technique which can be used in accordance with the present invention is to regulate the current available to the output predriver as a function of the total voltage supplied to the chip. CMOS circuits tend to switch more quickly as the total voltage difference between VCC and VSS is increased. This can be shown by examining the following relation:

$$Ids = Beta[(Vgs - Vt)(Vds) - (Vds^2/2)] \quad (8)$$

The above relation holds as long as $(Vgs - Vt) > Vds$, i.e., when the device is in the linear region. If the device is in saturation, the equation becomes:

$$Ids = (Beta/2)(Vgs - Vt)^2 \quad (9)$$

Once again, with higher VCC, the Vgs term is greater. This causes higher Ids which in turn can drive on-chip capacitances harder. For a more detailed discussion of this phenomenon, see N. H. E. Weste et al., *Principles of CMOS VLSI Design*, Addison-Wesley Publishing Company, Reading, Mass., 1985, p. 39. The VCC regulator shown in FIG. 4 senses this total applied voltage and decreases available current to the predrivers as this difference increases. As described in the preceding paragraph, this limits the switching speed of the output.

The fourth technique which can be used in accordance with the present invention helps to compensate for process variations. Due to variations in the processing of solid-state integrated circuit devices, the performance of the solid-state switching devices varies considerably. Circuitry in the VSS regulator shown in FIG. 4 senses variation in the drive capability of the P-channel solid-state switching devices and adjusts the series resistance between the output predriver NOR gates and ground so that the drive capability is stabilized over a broad range of process variation.

A fifth, optional, technique which can be used in accordance with the present invention to limit noise generation borrows from commonly used NMOS circuit design to control the HI level produced by the output circuit. Conventional CMOS output circuits produce a HI level of approximately 5 volts. The specification for TTL-compatible parts requires that a HI level be at least 2.4 volts. It is possible to limit the CMOS HI level to under 3 volts by replacing P-channel solid-state switching device T1 in FIG. 1 with an N-channel solid-state switching device as is shown with device MN10 in FIG. 4. This allows a reduction in dV/dt, while maintaining the same rise/fall time because the total voltage traversed by the output is less. It is important to note that this technique is optional. Thus any or all of the first four techniques may be used whether or not solid-state switching device T1 is N-channel or P-channel.

Figure 5:
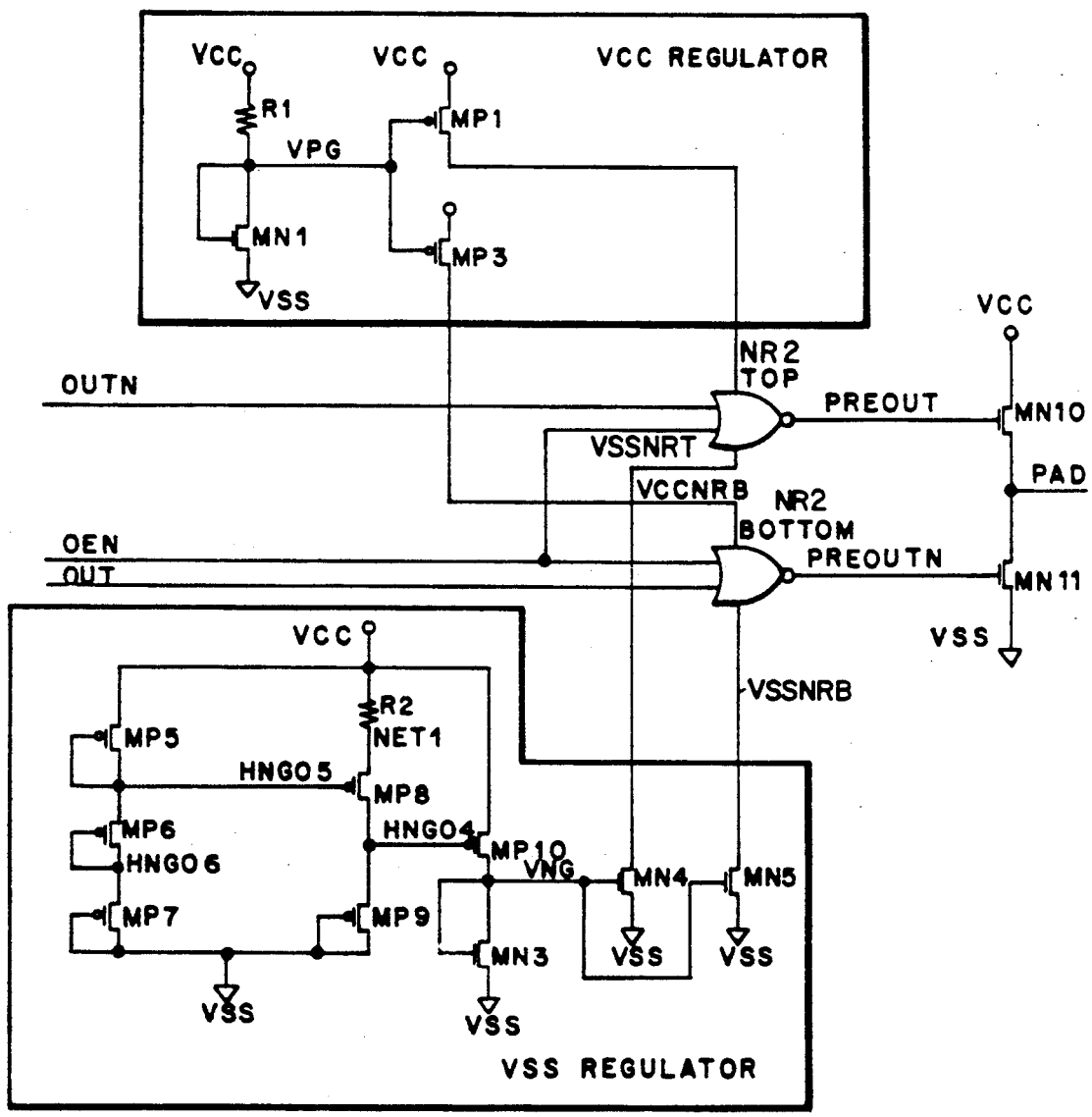
FIG. 5 is a still more detailed schematic diagram of one embodiment of the apparatus shown in FIG. 4.

These five techniques can be combined to form an advanced output circuit with maximum performance as will now be described with reference to FIG. 5. OUT, OUTN, and OEN are the same in FIGS. 4 and 5.

Global noise-control feedback is accomplished by summing all supply noise with the VCC and VSS regulators and using this to provide supply references for the output predrivers. If the noise causes a reduction in total applied voltage, the circuitry tends to slow down, as is shown by equations (8) and (9) above. This slow-down helps avoid additional noise generation. The case where supply noise causes the total applied voltage to increase will be discussed below.

Resistor R1 is a monolithic device which can be fabricated using a variety of techniques. Example techniques include but are not limited to diffusion of dopants into bulk or epitaxial silicon, deposition of polysilicon or titanium-tungsten, and use of the resistive properties of available N or P type wells. Resistor R1 and N-channel solid-state switching device MN1 shown in FIG. 5 form a voltage divider that detects both variations in total supply voltage, as well as the operating temperature of the output circuit. As VCC increases, the voltage at node VPG rises because of divider action. This causes a partial turn-off of devices MP1 and MP3. This partial turn off increases the resistance between the output predriver NOR gates and VCC, and slows down their drive of the output. Resistor R1 also serves as a temperature sensor. Resistors have a temperature coefficient of resistivity. This is due to increased lattice scattering of the carriers at higher temperatures. The equation that describes this observation is shown below:

$$R_{temp} = R_{nom} R_{nom}(tc1 * \Delta t) = R_{nom}(tc2 * \Delta t^2) \quad (10)$$

Where tc1 and tc2 are empirical parameters that must be measured for each process and each resistive material, $R_{temp}$ is the resistance of the device at a given junction temperature, $R_{nom}$ is the nominal resistance at room temperature, and $\Delta t$ is the difference between room temperature and the junction temperature of the device under test. As temperature increases, so does the resistance of device R1. This causes the voltage at node VPG to decrease, which turns devices MP1 and MP3 on more strongly. Thus at high temperature, where the outputs are naturally slower and hence quieter, they can run at closer to their maximum potential. Conversely, at cold temperatures, the outputs are slowed down to avoid unacceptable noise generation. Monolithic resistor R1, N-channel solid-state switching device MN1, and P-channel solid-state switching devices MP1 and MP3 form the VCC regulator subcircuit shown in FIG. 4 which is an illustrative circuit implementation of the first, second, and third techniques mentioned above.

P-channel solid-state switching devices MP5, MP6, MP7, MP8, MP9, and MP10, monolithic resistor R2, and N-channel solid-state switching devices MN3, MN4, and MN5 form a compensator that adjusts for P-channel solid-state switching device variations as described generally in technique four above. P-channel solid-state switching devices MP5, MP6, and MP7 are tied so that they are always in the saturation region. This stack, along with MP8 and R2, thus serves as an accurate threshold sensor. High threshold values indicate a weaker P-channel device. Assuming weaker than nominal P-channel devices, the effective voltage available to turn on device MP8 (which is one Vt below HNG05) decreases. This causes a partial turn-off of device MP8 and allows the voltage at HNG04 to fall due to divider action at this node. This falling voltage in turn turns device MP10 on harder. The resistance between node VNG and VCC declines, and VNG rises. This turns devices MN4 and MN5 on more strongly. Thus, the weaker the P-channel solid-state devices, the lower the series resistance between the output predriver NOR gates and VSS. Conversely, if the P-channel devices are stronger than nominal, the series resistance between the output predriver NOR gates and VSS rises. This counterbalancing action helps to compensate for the process variations present during P-channel solid-state device fabrication.

It will be understood that the foregoing is merely illustrative of the principles of this invention, and that various modifications can be made by those skilled in the art without departing from the scope and spirit of the invention. For example, various types of temperature sensitive devices can be used as part of the circuitry which senses and compensates for temperature variations as described above.

The invention claimed is:

1. An integrated circuit comprising:
   a source of relatively high potential,
   a source of relatively low potential,
   an output pad,
   an output driver circuit for selectively connecting said output pad to either of said sources,
   at least one NOR gate for producing an output signal for controlling said output driver circuit, said NOR gate having logical inputs whose logical states determine the logical state of said output signal, a first reference voltage input for receiving a relatively high reference voltage, and a second reference voltage input for receiving a relatively low reference voltage input, the difference between said first and second reference voltages influencing the speed at which said NOR gate output signal changes logical state in response to changes in the logical states of said logical inputs,
   first means for connecting said source of relatively high potential to said first reference voltage input, and
   second means for connecting said source of relatively low potential to said second reference voltage input, at least one of said first and second means including:
   a resistor element connected in series between the associated source and reference voltage input for decreasing the difference between said first and second reference voltages in response to a decrease in the difference between said relatively high potential and said relatively low potential in order to decrease the speed at which said NOR gate output signal changes logical state in response to changes in the logical states of said logical inputs.

2. An integrated circuit comprising:
   a source of relatively high potential,
   a source of relatively low potential,
   an output pad,
   an output driver circuit for relatively connecting said output pad to either of said sources,
   at least one NOR gate for producing an output signal for controlling said output driver circuit, said NOR gate having logical inputs whose logical states determine the logical state of said output signal, a first reference voltage input for receiving a relatively high reference voltage, and a second reference voltage input for receiving a relatively low reference voltage input, the difference between said first and second reference voltages influencing the speed at which said NOR gate output signal changes logical state in response to changes in the logical states of said logical inputs,
   first means for connecting said source of relatively high potential to said first reference voltage input, and
   second means for connecting said source of relatively low potential to said second reference voltage input, at least one of said first and second means including:
   a voltage divider connected in series between said sources for producing a voltage divider output signal having a potential intermediate the potentials of said sources,
   means responsive to said voltage divider output signal for modulating the potential produced by the source associated with said one of said first and second means to produce a control signal having a potential different from the potential of the associated source by an amount dependent on said voltage divider output signal, and
   means for applying said control signal to the reference voltage input associated with said one of said first and second means so that when the difference between said relatively high and relatively low potentials decreases, said control signal decreases the difference between said first and second reference voltages in order to decrease the speed at which said NOR gate output signal changes logical state in response to changes in the logical states of said logical inputs.

3. The apparatus defined in claim 2 wherein said voltage divider includes a resistor element.

4. The apparatus defined in claim 3 wherein said resistor element is temperature sensitive.

5. The apparatus defined in claim 4 wherein said resistor element is connected in said voltage divider so that said voltage divider output signal potential is brought closer to the potential of the one of said sources associated with the reference voltage input to which said control signal is applied when the temperature of the integrated circuit rises.

6. The apparatus defined in claim 2 wherein said voltage divider includes an element which is sensitive to the potential difference between said sources.

7. The apparatus defined in claim 6 wherein said element which is sensitive to the potential difference between said sources is connected in the voltage divider so that said voltage divider output signal potential is brought closer to the potential of the one of said sources associated with the reference voltage input to which said control signal is applied when the potential difference between said sources decreases.

8. The apparatus defined in claim 2 wherein said voltage divider includes an element which is sensitive to the drive capability of the integrated circuit.

9. The apparatus defined in claim 8 wherein said element which is sensitive to the drive capability of the integrated circuit is connected in the voltage divider so that said voltage divider output signal potential is brought closer to the potential of the one of said sources associated with the reference voltage input to which said control signal is applied when the drive capability of said integrated circuit decreases.

10. An integrated circuit comprising:
a source of relatively high potential;
a source of relatively low potential;
an output pad;
an output driver circuit for selectively connecting said output pad to either of said sources,
at least one NOR gate for producing an output signal for controlling said output driver circuit, said NOR gate having logical inputs whose logical states determine the logical state of said output signal, a first reference voltage input for receiving a relatively high reference voltage, and a second reference voltage input for receiving a relatively low reference voltage input, the difference between said first and second reference voltages influencing the speed at which said NOR gate output signal changes logical state in response to changes in the logical states of said logical inputs,
first means for connecting said source of relatively high potential to said first reference voltage input, and
second means for connecting said source of relatively low potential to said second reference voltage input, at least one of said first and second means including:
a temperature sensitive resistor element for reducing the difference between said first and second reference voltages when the temperature of the integrated circuit decreases in order to decrease the speed at which said NOR gate output signal changes logical state in response to changes in the logical states of said logical inputs.

11. An integrated circuit comprising:
a source of relatively high potential,
a source of relatively low potential,
an output pad,
an output driver circuit for selectively connecting said output pad to either of said sources,
at least one NOR gate for producing an output signal for controlling said output driver circuit, said NOR gate having logical inputs whose logical states determine the logical state of said output signal, a first reference voltage input for receiving a relatively high reference voltage, and a second reference voltage input for receiving a relatively low reference voltage input, the difference between said first and second reference voltages influencing the speed at which said NOR gate output signal changes logical state in response to changes in the logical states of said logical inputs,
first means for connecting said source of relatively high potential to said first reference voltage input, and
second means for connecting said source of relatively low potential to said second reference voltage input, at least one of said first and second means including:
a temperature sensitive voltage divider connected in series between said sources for producing a voltage divider output signal having a potential intermediate the potentials of said sources,
means responsive to said voltage divider output signal for modulating the potential produced by the source associated with said one of said first and second means to produce a control signal having a potential different from the potential of the associated source by an amount dependent on said voltage divider output signal, and
means for applying said control signal to the reference voltage input associated with said one of said first and second means so that when the temperature of said integrated circuit decreases, said control signal decreases the difference between said first and second reference voltages in order to decrease the speed at which said NOR gate output signal changes logical state in response to changes in the logical states of said logical inputs.

12. The apparatus defined in claim 11 wherein said voltage divider includes a temperature sensitive resistor element.

13. The apparatus defined in claim 12 wherein said resistor element is connected in said voltage divider so that said voltage divider output signal potential is brought closer to the potential of the one of said sources associated with the reference voltage input to which said control signal is applied when the temperature of said integrated circuit rises.

14. The apparatus defined in claim 11 wherein said voltage divider includes an element which is sensitive to the potential difference between said sources.

15. The apparatus defined in claim 14 wherein said element which is sensitive to the potential difference between said sources is connected in the voltage divider so that said voltage divider output signal potential is brought closer to the potential of the one of said sources associated with the reference voltage input to which said control signal is applied when the potential difference between said sources decreases.

16. The apparatus defined in claim 11 wherein said voltage divider includes an element which is sensitive to the drive capability of the integrated circuit.

17. The apparatus defined in claim 16 wherein said element which is sensitive to the drive capability of the integrated circuit is connected in the voltage divider so that said voltage divider output signal potential is brought closer to the potential of the one of said sources associated with the reference voltage input to which said control signal is applied when the drive capability of said integrated circuit decreases.

18. An integrated circuit comprising:
a source of relatively high potential,
a source of relatively low potential,
an output pad,
an output driver circuit for selectively connecting said output pad to either of said sources,
at least one NOR gate for producing an output signal for controlling said output driver circuit, said NOR gate having logical inputs whose logical states determine the logical state of said output signal, a first reference voltage input for receiving a relatively high reference voltage, and a second reference voltage input for receiving a relatively low reference voltage input, the difference between said first and second reference voltages influencing the speed at which said NOR gate output signal changes logical state in response to changes in the logical states of said logical inputs,
first means for connecting said source of relatively high potential to said first reference voltage input, and
second means for connecting said source of relatively low potential to said second reference voltage input, at least one of said first and second means including:

a voltage divider connected in series between said sources for producing a voltage divider output signal having a potential intermediate the potentials of said sources, and means responsive to said voltage divider output signal for modulating the potential produced by the source associated with said one of said first and second means to produce a control signal having a potential different from the potential of the associated source by an amount dependent on said voltage divider output signal, and means for applying said control signal to the reference voltage input associated with said one of said first and second means so that when the difference between said relatively high potential and said relatively low potential increases, said control signal decreases the difference between said first and second reference voltages in order to decrease the speed at which said NOR gate output signal changes logical state in response to changes in the logical states of said logical inputs.

19. The apparatus defined in claim 18 wherein said voltage divider includes an element which is sensitive to the potential difference between said sources.

20. The apparatus defined in claim 19 wherein said element which is sensitive to the potential difference between said sources is connected in the voltage divider so that said voltage divider output signal potential is brought closer to the potential of the one of said sources associated with the reference voltage input to which said control signal is applied when the potential difference between said sources decreases.

21. The apparatus defined in claim 18 wherein said voltage divider includes an element which is sensitive to the drive capability of the integrated circuit.

22. The apparatus defined in claim 21 wherein said element which is sensitive to the drive capability of the integrated circuit is connected in the voltage divider so that said voltage divider output signal potential is brought closer to the potential of the one of said sources associated with the reference voltage input to which said control signal is applied when the drive capability of said integrated circuit decreases.

23. An integrated circuit comprising:
a source of relatively high potential,
a source of relatively low potential,
an output pad,
an output driver circuit for selectively connecting said output pad to either of said sources,
at least one NOR gate for producing an output signal for controlling said output driver circuit, said NOR gate having logical inputs whose logical states determine the logical state of said output signal, a first reference voltage input for receiving a relatively high reference voltage, and a second reference voltage input for receiving a relatively low reference voltage input, the difference between said first and second reference voltages influencing the speed at which said NOR gate output signal changes logical state in response to changes in the logical states of said logical inputs, first means for connecting said source of relatively high potential to said first reference voltage input, and second means for connecting said source of relatively low potential to said second reference voltage input, at least one of said first and second means including:

a voltage divider responsive to the drive capability of the integrated circuit and connected in series between said sources for producing a voltage divider output signal having a potential intermediate the potential of said sources, and means response to said voltage divider output signal for modulating the potential produced by the associated source to produce a control signal having a potential different from the potential of the source associated with said one of said first and second means by an amount dependent on said voltage divider output signal, and means for applying said control signal to the reference voltage input associated with said one of said first and second means so that when said drive capability is relatively high, said control signal decreases the difference between said first and second reference voltages in order to decrease the speed at which said NOR gate output signal changes logical state in response to changes in the logical states of said logical inputs, and so that when said drive capability is relatively low, said control signal increases the difference between said first and second reference voltages in order to increase the speed at which said NOR gate output signal changes logical state in response to changes in the logical states of said logical inputs.

24. The apparatus defined in claim 23 wherein said voltage divider includes an element which is sensitive to the drive capability of the integrated circuit.

25. The apparatus defined in claim 24 wherein said element which is sensitive to the drive capability of the integrated circuit is connected in the voltage divider so that said voltage divider output signal potential is brought closer to the potential of the one of said sources associated with the reference voltage input to which said control signal is applied when the drive capability of said integrated circuit decreases.

* * * * *

UNITED STATES PATENT AND TRADEMARK OFFICE
CERTIFICATE OF CORRECTION

PATENT NO. : 5,066,873
DATED : November 19, 1991
INVENTOR(S) : Yiu-Fai Chan et al.

It is certified that error appears in the above-indentified patent and that said Letters Patent is hereby corrected as shown below:

| Column | Line | |
|---|---|---|
| 1 | 36 (Eq. (1)) | Change "T" to --I--. |
| 5 | 8 | After "supplies" insert a period. |
| 6 | 36 (Eq. (10)) | After $R_{nom}$ (first occurrence) insert a plus sign. |
| 6 | 36 (Eq. (10)) | Change the second equal sign to a plus sign. |
| 6 | 38 | Change "Where" to --where--. |

Signed and Sealed this

Third Day of May, 1994

Attest:

BRUCE LEHMAN

Attesting Officer     Commissioner of Patents and Trademarks